United States Patent
Nishimori et al.

(10) Patent No.: US 8,633,494 B2
(45) Date of Patent: Jan. 21, 2014

(54) SEMICONDUCTOR DEVICE AND METHOD FOR MANUFACTURING SEMICONDUCTOR DEVICE

(75) Inventors: Masato Nishimori, Atsugi (JP); Toshihide Kikkawa, Machida (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/552,894

(22) Filed: Jul. 19, 2012

(65) Prior Publication Data

US 2013/0032818 A1  Feb. 7, 2013

(30) Foreign Application Priority Data

Aug. 1, 2011  (JP) .................................. 2011-168781

(51) Int. Cl.
*H01L 31/0256* (2006.01)
*H01L 21/338* (2006.01)

(52) U.S. Cl.
USPC .............. 257/76; 257/E29.246; 257/E29.252; 257/E29.253; 257/E21.202; 438/172

(58) Field of Classification Search
CPC ...................... H01L 29/66462; H01L 29/7787; H01L 29/2003; H01L 21/02458; H01L 21/0254; H01L 33/007
USPC ............ 438/142, 167, 172; 257/76, E29.246, 257/E29.252, E29.243, E21.403, E29.253
See application file for complete search history.

(56) References Cited

U.S. PATENT DOCUMENTS

| | | | | |
|---|---|---|---|---|
| 2003/0136986 A1* | 7/2003 | ElMasry et al. | ............... | 257/295 |
| 2005/0059197 A1* | 3/2005 | Yamashita et al. | ............ | 438/198 |
| 2008/0197359 A1* | 8/2008 | Imanishi et al. | ................ | 257/76 |
| 2011/0272742 A1* | 11/2011 | Akiyama et al. | .............. | 257/194 |
| 2011/0284865 A1* | 11/2011 | Inoue et al. | ...................... | 257/76 |
| 2013/0105811 A1* | 5/2013 | Ando et al. | ...................... | 257/76 |

FOREIGN PATENT DOCUMENTS

JP  2002-359256 A1  12/2002

* cited by examiner

*Primary Examiner* — Nikolay Yushin
(74) *Attorney, Agent, or Firm* — Kratz, Quintos & Hanson, LLP

(57) ABSTRACT

A semiconductor device includes a buffer layer that is disposed over a substrate, a high-resistance layer that is disposed over the buffer layer, the high-resistance layer being doped with a transition metal for achieving high resistance, a low-resistance region that is disposed in a portion of the high-resistance layer or over the high-resistance layer, the low-resistance region being doped with an impurity element for achieving low resistance, an electron travel layer that is disposed over the high-resistance layer including the low-resistance region, an electron supply layer that is disposed over the electron travel layer, a gate electrode that is disposed over the electron supply layer, and a source electrode and a drain electrode that are disposed over the electron supply layer.

18 Claims, 14 Drawing Sheets

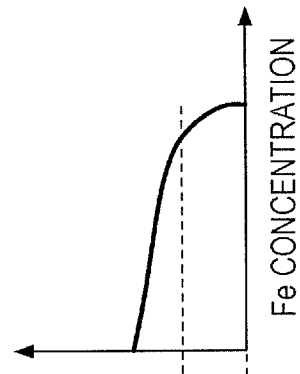
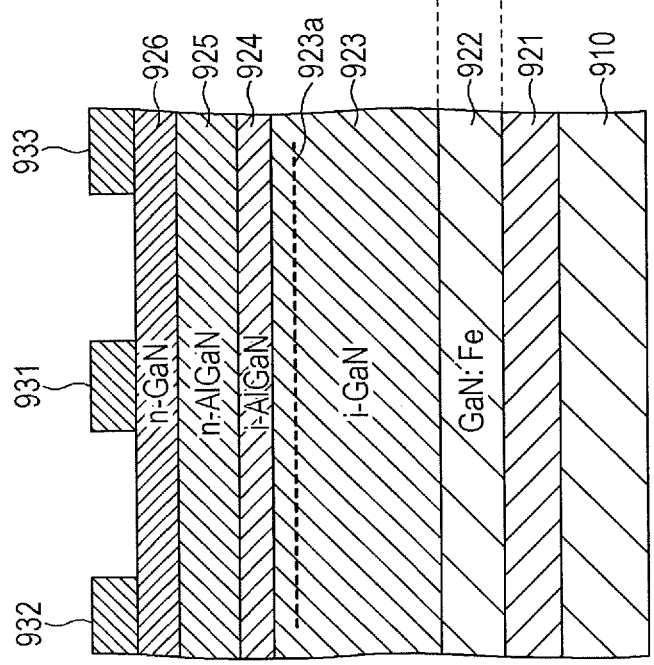
FIG. 2A RELATED ART
FIG. 2B RELATED ART

SEMICONDUCTOR DEVICE AND METHOD FOR MANUFACTURING SEMICONDUCTOR DEVICE

CROSS-REFERENCE TO RELATED APPLICATION

This application is based upon and claims the benefit of priority of the prior Japanese Patent Application No. 2011-168781, filed on Aug. 1, 2011, the entire contents of which are incorporated herein by reference.

FIELD

The embodiments discussed herein are related to a semiconductor device and a method for manufacturing the semiconductor device.

BACKGROUND

Nitride semiconductors such as GaN, AlN, and InN, materials including mixed crystals thereof, and the like have a wide band gap and therefore are used in high-power electronic devices, short-wavelength light-emitting devices, and the like. As for the high-power electronic devices, techniques related to field-effect transistors (FETs), particularly high-electron mobility transistors (HEMTs), are under development. HEMTs including such nitride semiconductors enable large-current, high-voltage, low-on-resistance operation and therefore are used in high-power, high-efficiency amplifiers, high-power switching devices, and the like.

An HEMT made of GaN or the like is formed in such a manner that a buffer layer is formed on a substrate of a semiconductor or the like, an electron travel layer of i-GaN or the like is epitaxially grown on the buffer layer by metal-organic vapor phase epitaxy (MOVPE) or the like. In particular, as illustrated in FIG. 1, a buffer layer 921, an electron travel layer 923 (923a illustrates a two dimensional electron gas.), a spacer layer 924, an electron supply layer 925, and a capping layer 926 are formed in series on a substrate 910 and a gate electrode 931, a source electrode 932, and a drain electrode 933 are formed on the capping layer 926. An HEMT including a configuration illustrated in FIG. 1 has a problem that since the buffer layer 921 has low resistance, a current flows through the buffer layer 921 and therefore a leakage current increases.

Therefore, an HEMT including a configuration in which a high-resistance layer 922 is disposed on a buffer layer 921 as illustrated in FIG. 2A is under investigation. In particular, the buffer layer 921, the high-resistance layer 922, an electron travel layer 923, a spacer layer 924, an electron supply layer 925, and a capping layer 926 are arranged in series on a substrate 910 and a gate electrode 931, a source electrode 932, and a drain electrode 933 are disposed on the capping layer 926. In the HEMT including the configuration illustrated in FIG. 2A, the high-resistance layer 922, which has high resistance, can be formed by doping GaN with a transition metal such as iron (Fe), thereby enabling increased insulation.

However, gas including containing the transition metal, such as Fe, used for doping remains in a growth furnace of an MOVPE system used to form the high-resistance layer 922 and therefore the transition metal, such as Fe, enters the electron travel layer 923, which is formed subsequently to the formation of the high-resistance layer 922. In particular, Fe enters the electron travel layer 923 to form a high-Fe concentration region as illustrated in the distribution of Fe in the high-resistance layer 922 and the electron travel layer 923 in FIG. 2B. The electron travel layer 923 is made of i-GaN or the like. The entrance of the transition metal, such as Fe, into the electron travel layer 923 reduces the mobility of electrons in the electron travel layer 923 to cause an increase in on-resistance. The increase in thickness of the electron travel layer 923 may be taken to reduce the on-resistance of the electron travel layer 923. However, the increase in thickness of the electron travel layer 923 causes an increase in leakage current.

Japanese Laid-open Patent Publication No. 2002-359256 is an example of related art.

SUMMARY

According to an aspect of the embodiments, a semiconductor device includes a buffer layer that is disposed over a substrate, a high-resistance layer that is disposed over the buffer layer, the high-resistance layer being doped with a transition metal for achieving high resistance, a low-resistance region that is disposed in a portion of the high-resistance layer or over the high-resistance layer, the low-resistance region being doped with an impurity element for achieving low resistance, an electron travel layer that is disposed over the high-resistance layer including the low-resistance region, an electron supply layer that is disposed over the electron travel layer, a gate electrode that is disposed over the electron supply layer, and a source electrode and a drain electrode that are disposed over the electron supply layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 2A and 2B are illustrations of another conventional semiconductor device;

DESCRIPTION OF EMBODIMENTS

Figure 1:
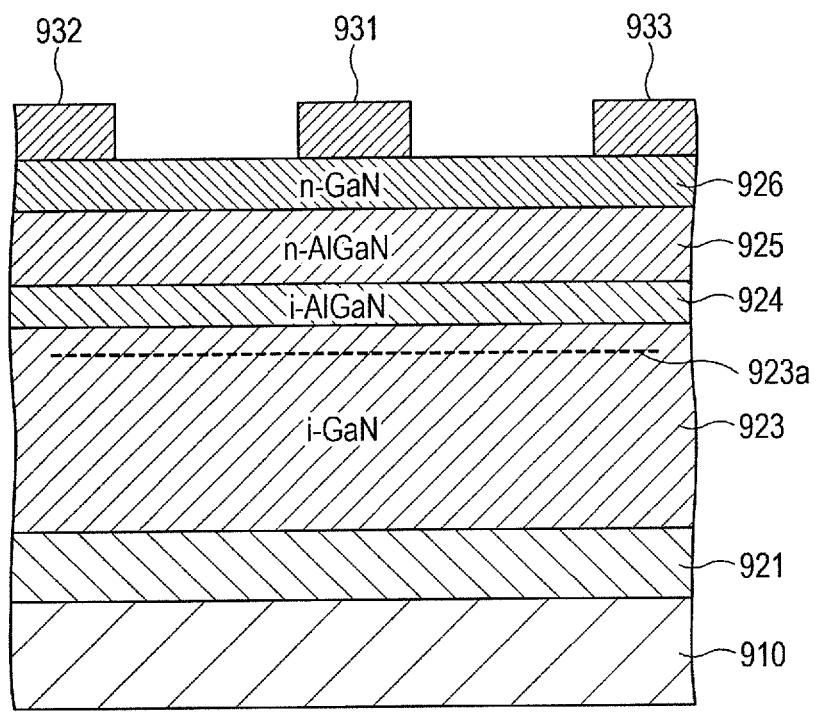
FIG. 1 is an illustration of a conventional semiconductor device.
Figure 3:
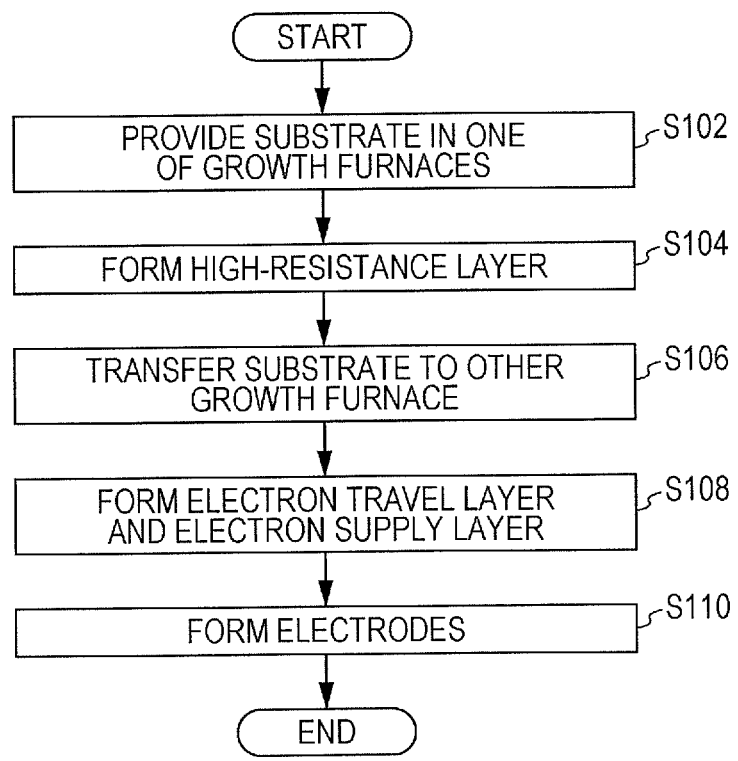
FIG. 3 is a method for manufacturing a semiconductor device according to a first embodiment.

Hereinafter, embodiments are described. The same members are denoted by the same reference numerals and will not be described in detail.

First Embodiment

A method for manufacturing a semiconductor device according to a first embodiment is described below with reference to FIGS. 3 and 4A to 4C. In this embodiment, the method uses an MOVPE system including two growth furnaces for epitaxially growing semiconductor layers.

First, as illustrated in Step 102 (S102), a substrate 10 made of SiC or the like is provided in one of the growth furnaces. In this embodiment, the substrate 10 is made of SiC and may be made of a semiconductor such as GaN or an insulator such as sapphire.

Figure 4A:
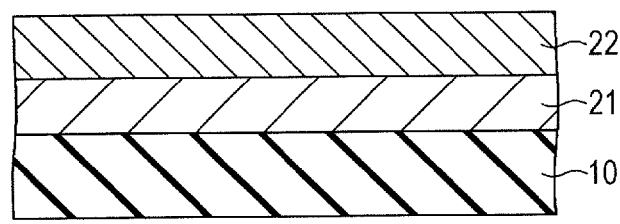
FIGS. 4A to 4C are illustrations of steps of the method for manufacturing the semiconductor device according to the first embodiment.

Next, as illustrated in Step 104 (S104), in this growth furnace, a buffer layer 21 and a high-resistance layer 22 are formed. In particular, as illustrated in FIG. 4A, the buffer layer 21 and the high-resistance layer 22 are formed in series on the substrate 10 by MOVPE. The buffer layer 21 and high-resistance layer 22 are formed at a reduced pressure in such a state that the substrate 10 is heated.

The buffer layer 21 is made of a material including AlN and is formed in such a manner that a trimethyl aluminum (TMAl) gas and an ammonia ($NH_3$) gas are supplied to this growth furnace. The buffer layer 21 is also referred to as an AlN nucleation layer.

The high-resistance layer 22 has a thickness of 200 nm and is made of GaN doped with Fe. The high-resistance layer 22 is formed in such a manner that a trimethyl gallium (TMGa) gas, an $NH_3$ gas, and a ferrous chloride ($FeCl_2$) gas for doping GaN with Fe, which acts as an impurity element, are supplied to this growth furnace. The ferrous chloride gas is generated by the reaction of iron with hydrochloric acid. The feed rate of the ferrous chloride gas is controlled such that GaN is doped with Fe at a given concentration. This allows the high-resistance layer 22 to be formed on the buffer layer 21 such that the high-resistance layer 22 is doped with Fe at a concentration of $1 \times 10^{18}$ cm$^{-3}$. In this embodiment, the high-resistance layer 22 is doped with Fe, which acts as an impurity element, at a concentration of $1 \times 10^{17}$ cm$^{-3}$ or more so as to have a desired resistance. Examples of an impurity element used to dope the high-resistance layer 22 include transition metals such as Ti, V, Cr, Mn, Co, Ni, and Cu in addition to Fe.

Next, as illustrated in Step 106 (S106), the substrate 10 including the high-resistance layer 22 is taken out of this growth furnace and is then provided in the other growth furnace.

Figure 4B:
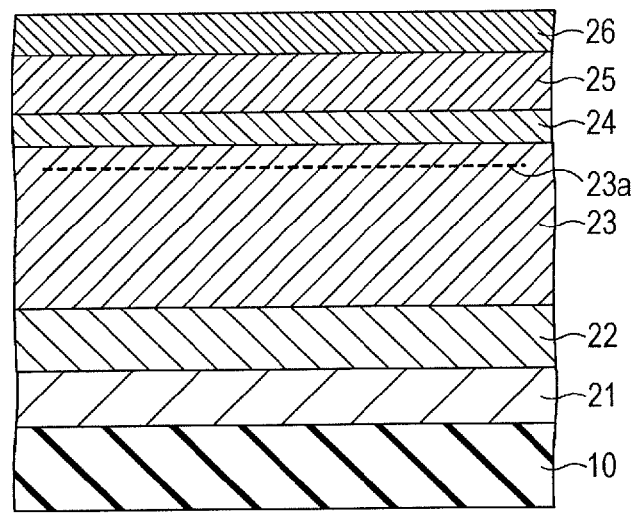

Next, as illustrated in Step 108 (S108), in the other growth furnace, an electron travel layer 23 (Here, 23a illustrates a two dimensional electron gas.), a spacer layer 24, an electron supply layer 25, and a capping layer 26 are formed. In particular, as illustrated in FIG. 4B, the electron travel layer 23, the spacer layer 24, the electron supply layer 25, and the capping layer 26 are formed in series on the high-resistance layer 22. The electron travel layer 23, the spacer layer 24, the electron supply layer 25, and the capping layer 26 are formed at a reduced pressure in such a state that the substrate 10 is heated.

The electron travel layer 23 has a thickness of about 100 nm and is made of i-GaN. The electron travel layer 23 is formed in such a manner that a TMGa gas and an $NH_3$ gas are supplied to the other growth furnace.

The spacer layer 24 has a thickness of about 3 nm and is made of i-$Al_{0.25}Ga_{0.75}N$. The spacer layer 24 is formed in such a manner that a TMAl gas, a TMGa gas, and an $NH_3$ gas are supplied to the other growth furnace.

The electron supply layer 25 has a thickness of about 20 nm and is made of n-$Al_{0.25}Ga_{0.75}N$. The electron supply layer 25 is formed in such a manner that a TMAl gas, a TMGa gas, an $NH_3$ gas, and a silane ($SiH_4$) gas for doping $Al_{0.25}Ga_{0.75}N$ with Si are supplied to the other growth furnace. This allows the electron supply layer 25 to be formed such that the concentration of Si, which acts as an impurity element, in the electron supply layer 25 is $2 \times 10^{18}$ cm$^{-3}$.

The capping layer 26 has a thickness of about 5 nm and is made of n-GaN. The capping layer 26 is formed in such a manner that a TMGa gas, an $NH_3$ gas, and an $SiH_4$ gas for doping GaN with Si, which acts as an impurity element, are supplied to the other growth furnace. This allows the capping layer 26 to be formed such that the concentration of Si in the capping layer 26 is $2 \times 10^{18}$ cm$^{-3}$.

Figure 4C:
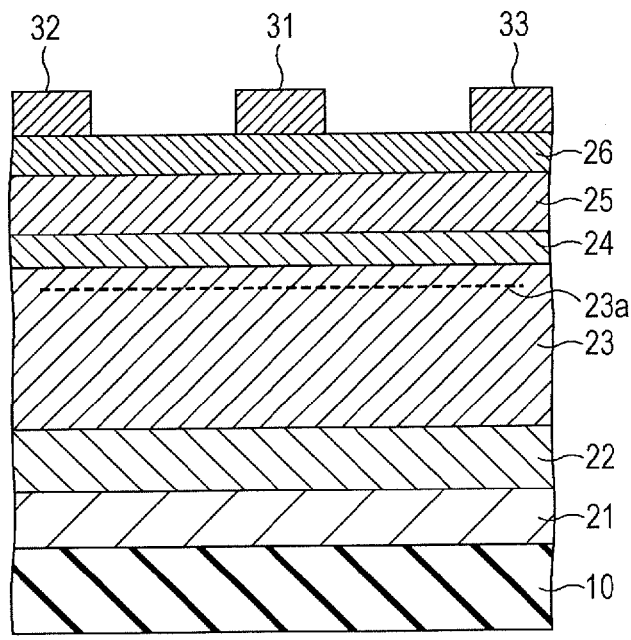

Next, as illustrated in Step 110 (S110), electrodes are formed on the capping layer 26. In particular, as illustrated in FIG. 4C, a gate electrode 31, a source electrode 32, and a drain electrode 33 are formed on the capping layer 26. A procedure for forming these electrodes is as described below. A photoresist is applied to the capping layer 26, is exposed using an exposure system, and is then developed, whereby a resist pattern, which is not illustrated, including openings corresponding to regions for forming the gate electrode 31, the source electrode 32, and the drain electrode 33 is formed. Thereafter, a metal film is formed over the resist pattern by vacuum vapor deposition or the like and is then immersed in an organic solvent, whereby a portion of the metal film that is disposed on the resist pattern is removed together with the resist pattern. This allows the gate electrode 31, the source electrode 32, and the drain electrode 33 to be formed.

Figure 5A:
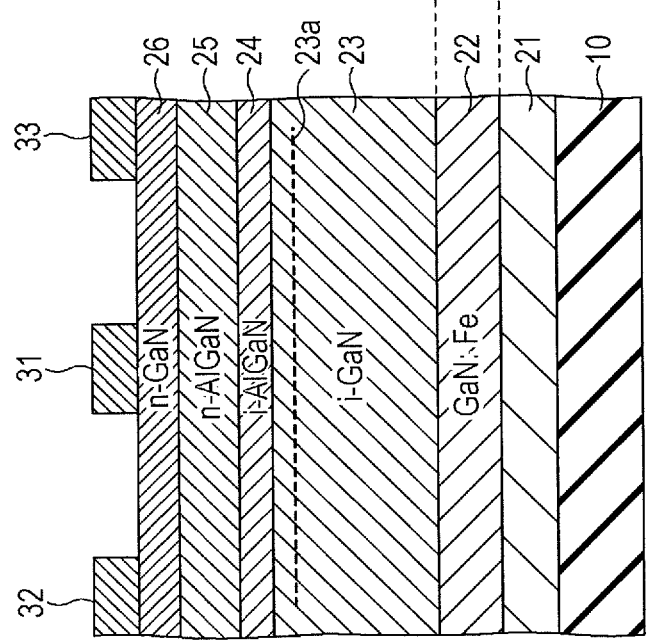
FIGS. 5A and 5B are structural views of the semiconductor device according to the first embodiment.
Figure 5B:
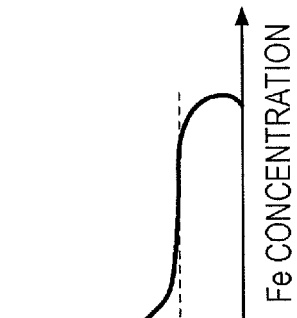

FIG. 5A illustrates the semiconductor device according to this embodiment and FIG. 5B illustrates the distribution of the Fe concentration thereof. In this embodiment, after the high-resistance layer 22 is formed, the other growth furnace, which is different from the growth furnace used to form the high-resistance layer 22, is used to form the electron travel layer 23 (Here, 23a illustrates a two dimensional electron gas.) and the like. The other growth furnace is not used to form any layer or film doped with Fe or the like. Thus, no gas including Fe is present in the other growth furnace and therefore Fe hardly enters the electron travel layer 23. This enables low on-resistance without causing an increase in leakage current.

Figure 6A:
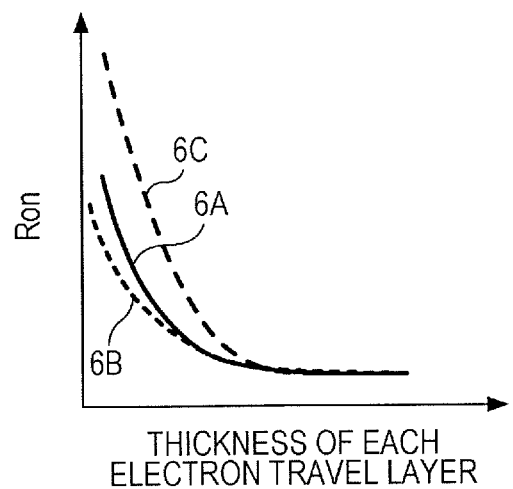
FIGS. 6A to 6C are graphs illustrating properties of the semiconductor device according to the first embodiment.
Figure 6B:
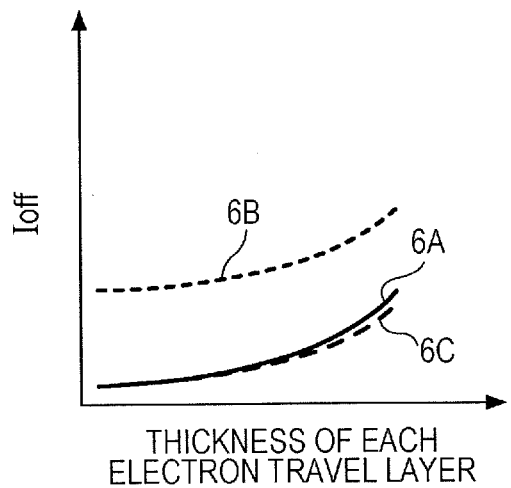
Figure 6C:
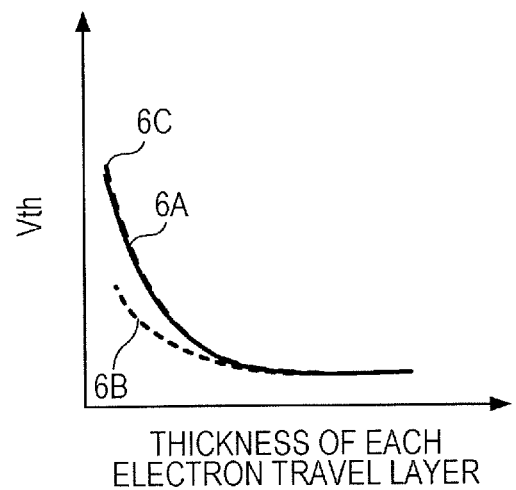

This is further described in detail with reference to FIGS. 6A to 6C. In FIGS. 6A to 6C, Curve 6A indicates properties of HEMTs corresponding to the semiconductor device according to this embodiment, Curve 6B indicates properties of HEMTs including no high-resistance layer, and Curve 6C indicates properties of HEMTs each including such a high-resistance layer as illustrated in FIG. 2A.

FIG. 6A illustrates the relationship between the thickness of each electron travel layer made of i-GaN and the on-resistance (Ron). When the electron travel layers are thin, the HEMTs which are indicated by Curve 6A and which correspond to the semiconductor device according to this embodiment are lower in on-resistance than the HEMTs which are indicated by Curve 6C and which include the high-resistance layer and are close in on-resistance to the HEMTs which are indicated by Curve 6B and which include no high-resistance layer.

FIG. 6B illustrates the relationship between the thickness of each electron travel layer made of i-GaN and the off-current (Ioff). The off-current is also referred to as leakage current. When the electron travel layers are thin, the HEMTs which are indicated by Curve 6A and which correspond to the semiconductor device according to this embodiment are lower in leakage current than the HEMTs which are indicated by Curve 6B and which include no high-resistance layer and are substantially equal in leakage current to the HEMTs which are indicated by Curve 6C and which include the high-resistance layer.

FIG. 6C illustrates the relationship between the thickness of each electron travel layer made of i-GaN and the threshold voltage (Vth). When the electron travel layers are thin, the HEMTs which are indicated by Curve 6A and which correspond to the semiconductor device according to this embodiment are higher in threshold voltage than the HEMTs which are indicated by Curve 6B and which include no high-resistance layer and are substantially equal in threshold voltage to the HEMTs which are indicated by Curve 6C and which include the high-resistance layer. An increase in threshold voltage allows a normally off mode to be readily achieved. Therefore, the semiconductor device according to this embodiment can be rendered normally off because the electron travel layer 23 has a reduced thickness.

In a step subsequent to the formation of the high-resistance layer 22, Fe or the like may possibly be diffused in the electron travel layer 23 by heat applied to the electron travel layer 23 during formation. However, the degree of diffusion of Fe or the like in the electron travel layer 23 in this case is low as compared to the case where Fe enters the electron travel layer 23 because of an Fe-including gas remaining in the growth furnace used to form the high-resistance layer 22.

As described above, the HEMTs corresponding to the semiconductor device according to this embodiment have advantages similar to those of the HEMT including the configuration illustrated in FIG. 1 and the HEMT including the configuration illustrated in FIG. 2A, that is, advantages that the on-resistance is low, the leakage current is small, and the threshold voltage is high in the case of forming a thin electron travel layer.

Second Embodiment

A method for manufacturing a semiconductor device according to a second embodiment is described below with reference to FIGS. 7A to 7C, 8A, and 8B.

Figure 7A:
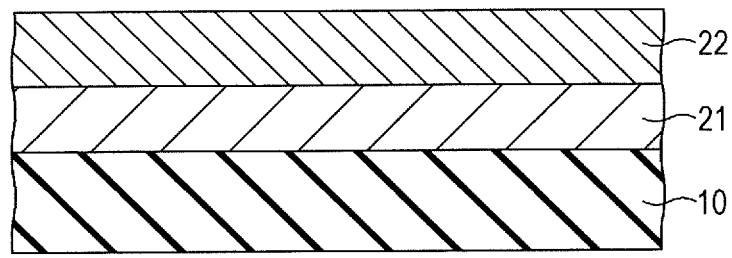
FIGS. 7A to 7C are illustrations of steps of a method for manufacturing a semiconductor device according to a second embodiment.

First, as illustrated in FIG. 7A, a buffer layer 21 and a high-resistance layer 22 are formed in series on a substrate 10 by MOVPE. The buffer layer 21 and the high-resistance layer 22 are formed at a reduced pressure in such a state that the substrate 10 is heated. In this embodiment, the substrate 10 is made of SiC and may be made of a semiconductor such as GaN or an insulator such as sapphire.

The buffer layer 21 is made of a material including AlN. The buffer layer 21 is formed in such a manner that a TMAl gas and an $NH_3$ gas are supplied to a growth furnace of an MOVPE system.

For example, the high-resistance layer 22 has a thickness of 200 nm and is made of GaN doped with Fe. The high-resistance layer 22 is formed in such a manner that a TMGa gas, an $NH_3$ gas, and an $FeCl_2$ gas for doping GaN with Fe, which acts as an impurity element, are supplied to the growth furnace. This allows the high-resistance layer 22 to be formed on the buffer layer 21 such that the high-resistance layer 22 is doped with Fe at a concentration of $1\times10^{18}$ $cm^{-3}$. In this embodiment, the high-resistance layer 22 is doped with Fe, which acts as an impurity element, at a concentration of $1\times10^{17}$ $cm^{-3}$ or more so as to have a desired resistance. Examples of an impurity element used to dope the high-resistance layer 22 include transition metals such as Ti, V, Cr, Mn, Co, Ni, and Cu other than Fe.

Figure 7B:
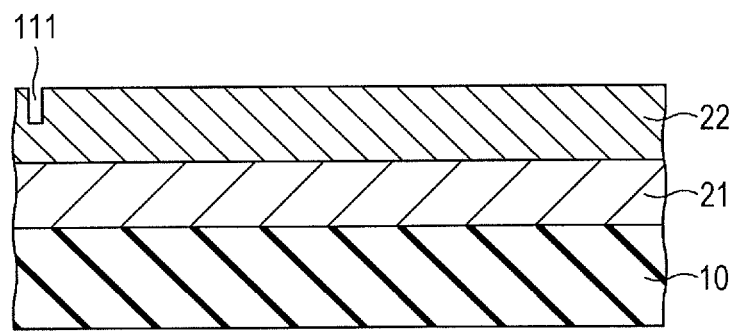

Next, as illustrated in FIG. 7B, an alignment mark 111 is formed in a surface portion of the high-resistance layer 22. In particular, after the substrate 10 is taken out of the MOVPE system, a photoresist is applied to the high-resistance layer 22, is exposed using an exposure system, and is then developed, whereby a resist pattern, which is not illustrated, including an opening corresponding to a region for forming the alignment mark 111 is formed. Thereafter, the resist pattern is dry-etched using a $Cl_2$-including gas such that a portion of the high-resistance layer 22 that is uncovered with the resist pattern is removed, whereby the alignment mark 111 is formed. Dry-etching conditions for forming the alignment mark 111 include an RF power of 200 W and a bias power of 30 W.

Figure 7C:
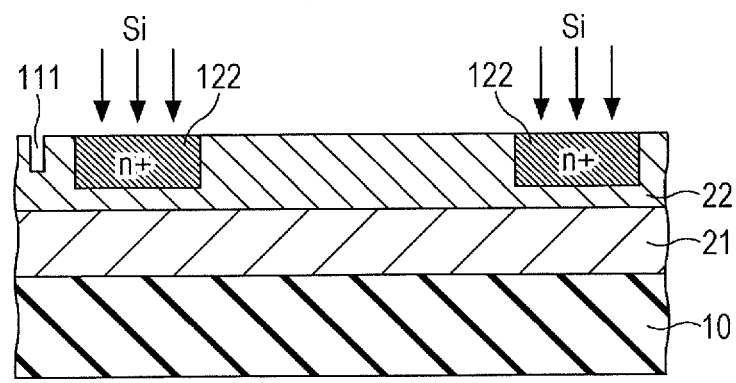

Next, as illustrated in FIG. 7C, low-resistance regions 122 are each formed in a given area of the high-resistance layer 22. In particular, a photoresist is applied to the high-resistance layer 22, is exposed using an exposure system, and is then developed, whereby a resist pattern, which is not illustrated, including openings corresponding to regions for forming the low-resistance regions 122 is formed. Thereafter, Si or the like, which acts as an impurity element, is ion-implanted into regions of the high-resistance layer 22 that are uncovered with this resist pattern, whereby the low-resistance regions 122 are formed. In this operation, Si is ion-implanted at a dose of $1\times10^{13}$ $cm^{-2}$ such that the concentration of Si in each low-resistance region 122 is $2\times10^{18}$ $cm^{-3}$. That is, the low-resistance regions 122 are formed in such a manner that regions of the high-resistance layer 22 that are used to form the low-resistance regions 122 are doped with Si such that the concentration of Si in each low-resistance region 122 is higher than the concentration of Fe, which acts as an impurity element, in the high-resistance layer 22. The low-resistance regions 122 are not located directly under a region for forming a gate electrode 31 below but are each located directly under a region for forming a source electrode 32 or a drain electrode 33. Therefore, this resist pattern is formed in such a manner that alignment is performed using the alignment mark 111 such that each of the low-resistance regions 122 is formed in a corresponding one of the given areas. In the above description, Si, which is an implanted impurity element, is used to form the low-resistance regions 122. However, an impurity element, such as germanium (Ge) or oxygen, other than Si may be used to form the low-resistance regions 122.

Figure 8A:
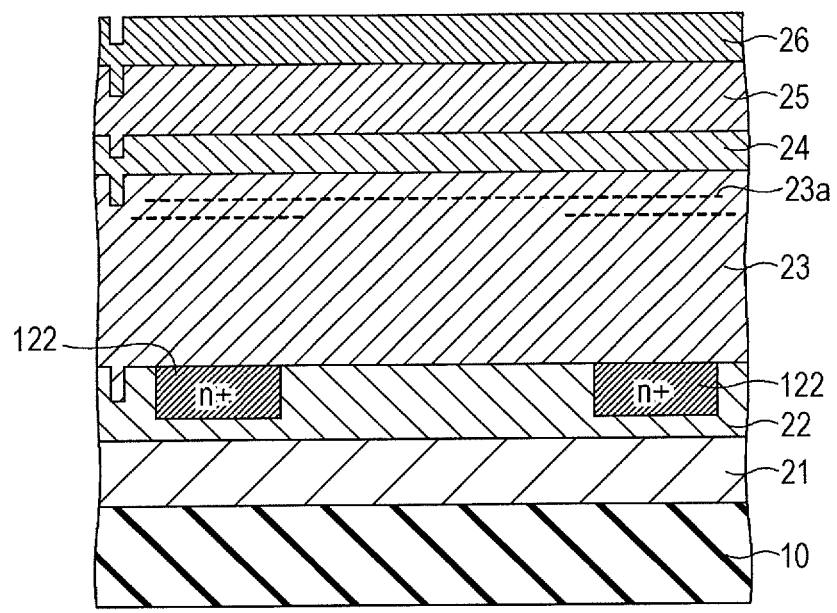
FIGS. 8A and 8B are illustrations of steps of the method for manufacturing the semiconductor device according to the second embodiment.

Next, as illustrated in FIG. 8A, an electron travel layer 23 (Here, 23a illustrates a two dimensional electron gas.), a spacer layer 24, an electron supply layer 25, and a capping layer 26 are formed in series on the high-resistance layer 22 including the low-resistance regions 122 by MOVPE. In this operation, as described in the first embodiment, these layers are preferably formed in a growth furnace of the MOVPE system that is different from the growth furnace used to form the high-resistance layer 22.

The electron travel layer 23 has a thickness of about 100 nm and is made of i-GaN. The electron travel layer 23 is formed in such a manner that a TMGa gas and an $NH_3$ gas are supplied to this growth furnace.

The spacer layer 24 has a thickness of about 3 nm and is made of i-$Al_{0.25}Ga_{0.75}N$. The spacer layer 24 is formed in such a manner that a TMAl gas, a TMGa gas, and an $NH_3$ gas are supplied to this growth furnace.

The electron supply layer 25 has a thickness of about 20 nm and is made of n-$Al_{0.25}Ga_{0.75}N$. The electron supply layer 25 is formed in such a manner that a TMAl gas, a TMGa gas, an $NH_3$ gas, and a $SiH_4$ gas for doping $Al_{0.25}Ga_{0.75}N$ with Si, which acts as an impurity element, are supplied to this growth furnace. This allows the electron supply layer 25 to be formed such that the concentration of Si in the electron supply layer 25 is $2\times10^{18}$ $cm^{-3}$.

The capping layer 26 has a thickness of about 5 nm and is made of n-GaN. The capping layer 26 is formed in such a manner that a TMGa gas, an $NH_3$ gas, and a $SiH_4$ gas for doping GaN with Si, which acts as an impurity element, are supplied to this growth furnace. This allows the capping layer 26 to be formed such that the concentration of Si in the capping layer 26 is $2\times10^{18}$ $cm^{-3}$.

Figure 8B:
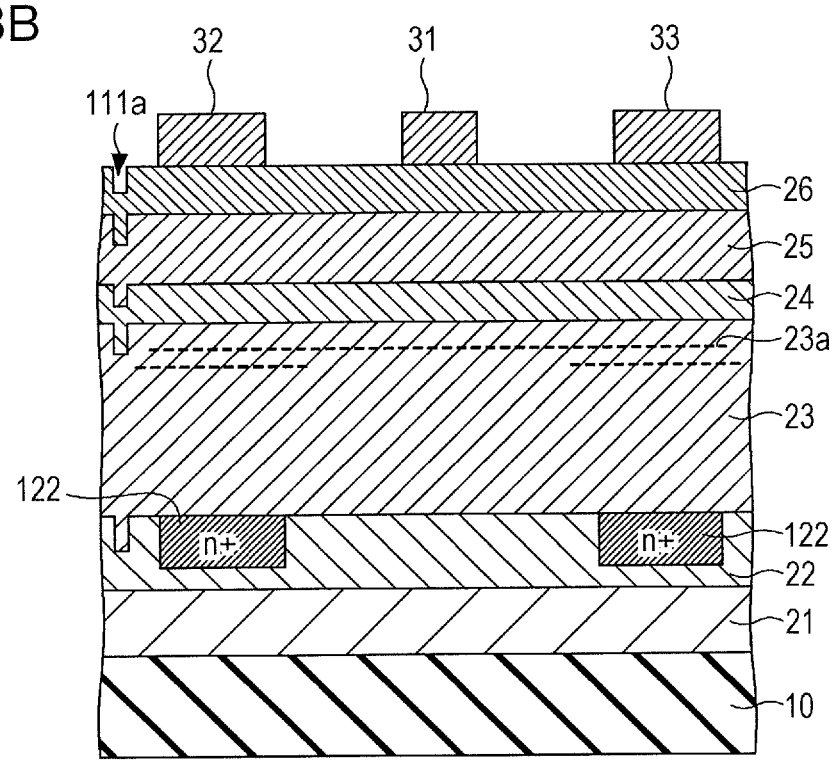

Next, as illustrated in FIG. 8B, the gate electrode 31, the source electrode 32, and the drain electrode 33 are formed on the capping layer 26. A procedure for forming these electrodes is as described below. A photo-resist is applied to the capping layer 26, is exposed using an exposure system, and is then developed, whereby a resist pattern, which is not illustrated, including openings corresponding to regions for forming the gate electrode 31, the source electrode 32, and the drain electrode 33 is formed. In this operation, this resist pattern is formed in such a manner that alignment is performed using an alignment mark 111a such that the gate electrode 31 is not located directly above one of the low-resistance regions 122 but each of the source electrode 32 and the drain electrode 33 is located directly above a corresponding one of the low-resistance regions 122. Thereafter, a metal film is formed over this resist pattern by vacuum vapor deposition or the like and is then immersed in an organic solvent or the like, whereby a portion of the metal film that is disposed on the resist pattern is removed together with the resist pattern. This allows the gate electrode 31, the source electrode 32, and the drain electrode 33 to be formed. As described above, each of the source electrode 32 and the drain electrode 33 is formed directly above a corresponding one of the low-resistance regions 122 and the gate electrode 31 is formed directly above a region other than the low-resistance regions 122, that is, a region of the high-resistance layer 22 that is in contact with the electron travel layer 23. The electron travel layer 23, the spacer layer 24, the electron supply layer 25, and the capping layer 26 are arranged in series on the alignment mark 111, which is disposed in the surface portion of the high-resistance layer 22. The same shape as the alignment mark 111 is held in each of these layers, resulting in that the alignment mark 111a is formed in a surface portion of the capping layer 26.

Figure 9:
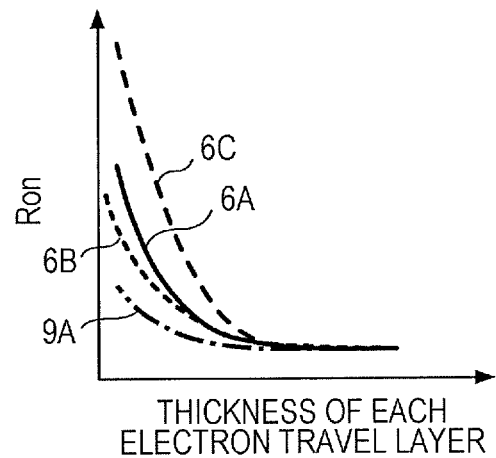
FIG. 9 is a graph illustrating properties of the semiconductor device according to the second embodiment.

The semiconductor device according to this embodiment is an HEMT and can be manufactured as described above. In this embodiment, a two-dimensional electron gas (2DEG) 23a is formed in the electron travel layer 23 and the electron distribution of the 2DEG 23a can be increased directly under the source electrode 32 and the drain electrode 33. Therefore, as indicated by the relationship between the thickness of each electron travel layer and the on-resistance (Ron) illustrated in FIG. 9, HEMTs which are indicated by Curve 9A and which correspond to the semiconductor device according to this embodiment are lower in on-resistance than HEMTs indicated by Curves 6A to 6C. The HEMTs indicated by Curve 9A are substantially equal in leakage current (Ioff) and threshold voltage (Vth) to HEMTs corresponding to the semiconductor device according to the first embodiment. Thus, in the case of forming a thin electron travel layer, the HEMTs corresponding to the semiconductor device according to this embodiment have advantages: low on-resistance, low leakage current, and high threshold voltage. The semiconductor device according to this embodiment can be rendered normally off because the electron travel layer 23 has a small thickness. In this embodiment, the low-resistance regions 122 are formed in the high-resistance layer 22 as described above. However, the high-resistance layer 22 may be replaced with a low-resistance layer and a high-resistance region may be formed in the low-resistance layer.

Figure 10:
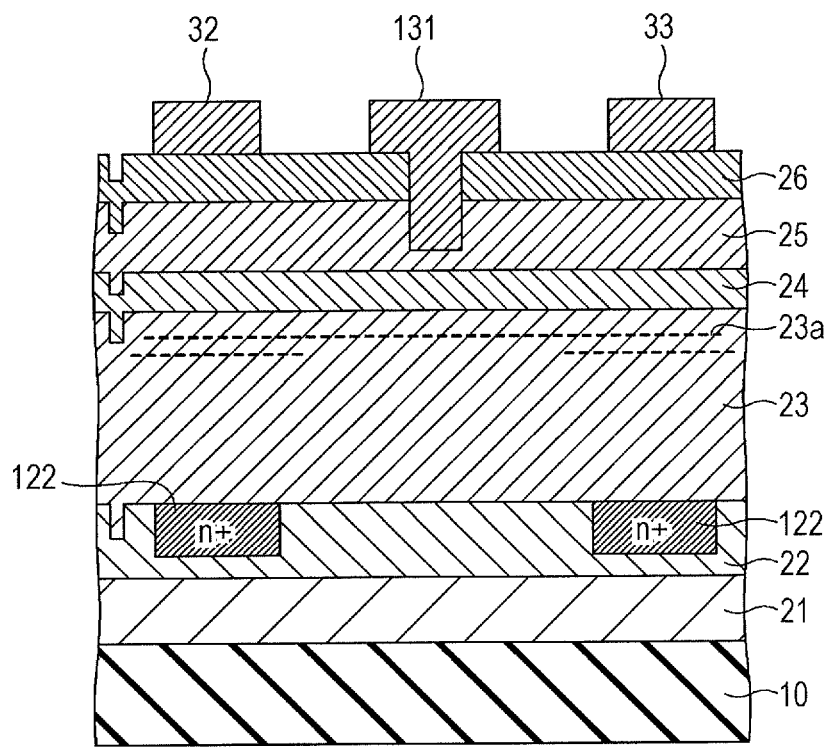
FIG. 10 is a structural view of a modification of the semiconductor device according to the second embodiment.

In the semiconductor device according to this embodiment, a gate electrode may have a recess structure. In particular, as illustrated in FIG. 10, the capping layer 26 and the electron supply layer 25 are partly removed by etching or the like, whereby an opening is formed. A gate electrode 131 is formed in the opening. The gate electrode 131 is formed so as to have a recess structure as described above; hence, the electron distribution of the 2DEG 23a can be reduced directly under the gate electrode 131 and the threshold voltage can be rendered positive. This allows a normally-off HEMT to be readily achieved.

Third Embodiment

A method for manufacturing a semiconductor device according to a third embodiment is described below with reference to FIGS. 11A to 11C and 12.

Figure 11A:
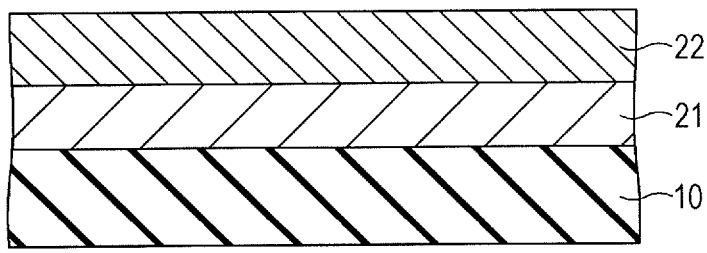
FIGS. 11A to 11C are illustrations of steps of a method for manufacturing a semiconductor device according to a third embodiment.

First, as illustrated in FIG. 11A, a buffer layer 21 and a high-resistance layer 22 are formed in series on a substrate 10 by MOVPE.

The buffer layer 21 is made of a material including AlN. The buffer layer 21 is formed in such a manner that a TMAl gas and an $NH_3$ gas are supplied to a growth furnace of an MOVPE system.

The high-resistance layer 22 has a thickness of 200 nm and is made of GaN doped with Fe. The high-resistance layer 22 is formed in such a manner that a TMGa gas, an $NH_3$ gas, and an $FeCl_2$ gas for doping GaN with Fe, which acts as an impurity element, are supplied to the growth furnace. This allows the high-resistance layer 22 to be formed on the buffer layer 21 such that the high-resistance layer 22 is doped with Fe at a concentration of $1\times10^{18}$ $cm^{-3}$.

Figure 11B:
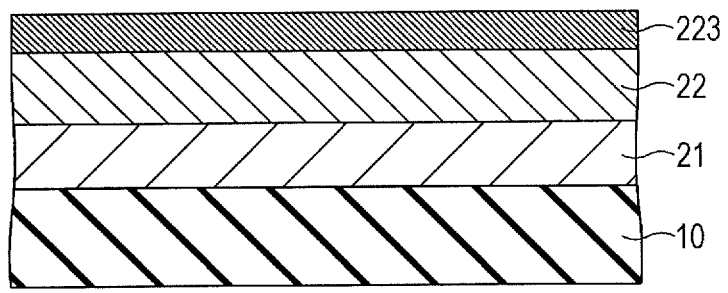

Next, as illustrated in FIG. 11B, a low-resistance layer 223 is formed on the high-resistance layer 22. The low-resistance layer 223 has a thickness of about 100 nm and is made of n-GaN. The low-resistance layer 223 is formed in such a manner that a TMGa gas, an $NH_3$ gas, and a $SiH_4$ gas for doping GaN with Si, which acts as an impurity element, are supplied to the growth furnace. This allows the low-resistance layer 223 to be formed such that the concentration of Si in the low-resistance layer 223 is $2\times10^{18}$ $cm^{-3}$. The concentration of Si, which acts as an impurity element, in the low-resistance layer 223 is preferably higher than the concentration of Fe, which acts as an impurity element, in the high-resistance layer 22. Examples of an impurity element used to dope the low-resistance layer 223 include Ge and oxygen in addition to Si. In this application, the low-resistance layer 223 is referred to as a low-resistance region in some cases.

Figure 11C:
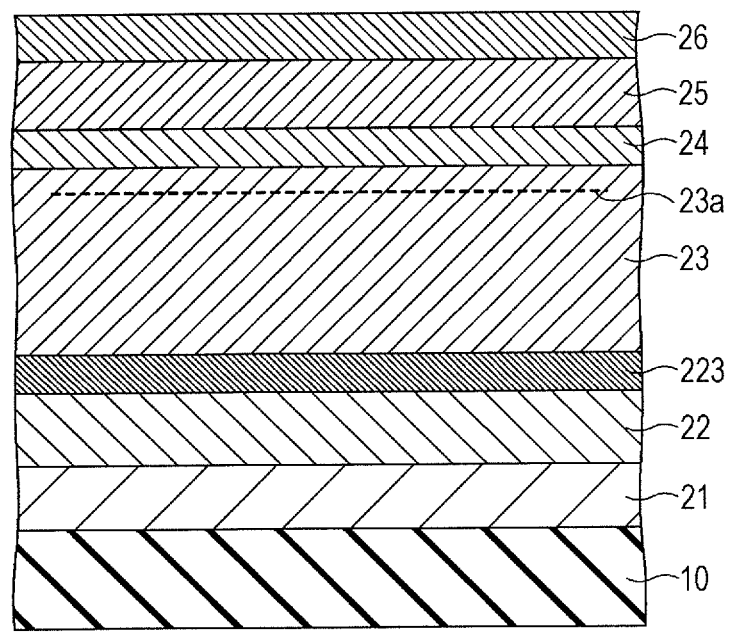

Next, as illustrated in FIG. 11C, an electron travel layer 23, a spacer layer 24, an electron supply layer 25, and a capping layer 26 are formed in series on the low-resistance layer 223 by MOVPE. Here, 23a illustrates a two dimensional electron gas.

The electron travel layer 23 has a thickness of about 100 nm and is made of i-GaN. The electron travel layer 23 is formed in such a manner that a TMGa gas and an $NH_3$ gas are supplied to the growth furnace.

The spacer layer 24 has a thickness of about 3 nm and is made of i-$Al_{0.25}Ga_{0.75}N$. The spacer layer 24 is formed in such a manner that a TMAl gas, a TMGa gas, and an NH$_3$ gas are supplied to the growth furnace.

The electron supply layer 25 has a thickness of about 20 nm and is made of n-Al$_{0.25}$Ga$_{0.75}$N. The electron supply layer 25 is formed in such a manner that a TMAl gas, a TMGa gas, an NH$_3$ gas, and an SiH$_4$ gas for doping Al$_{0.25}$Ga$_{0.75}$N with Si, which acts as an impurity element, are supplied to the other growth furnace. This allows the electron supply layer 25 to be formed such that the concentration of Si in the electron supply layer 25 is $2\times10^{18}$ cm$^{-3}$.

The capping layer 26 has a thickness of about 5 nm and is made of n-GaN. The capping layer 26 is formed in such a manner that a TMGa gas, an NH$_3$ gas, and a SiH$_4$ gas for doping GaN with Si, which acts as an impurity element, are supplied to the growth furnace. This allows the capping layer 26 to be formed such that the concentration of Si in the capping layer 26 is $2\times10^{18}$ cm$^{-3}$.

Figure 12:
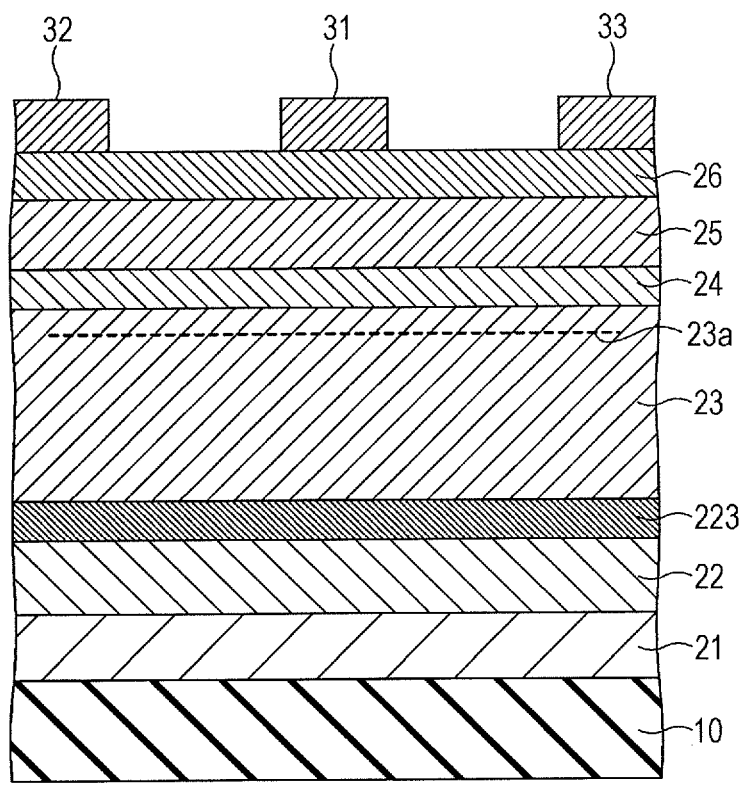
FIG. 12 is an illustration of a step of the method for manufacturing the semiconductor device according to the third embodiment.

Next, as illustrated in FIG. 12, a gate electrode 31, a source electrode 32, and a drain electrode 33 are formed on the capping layer 26. A procedure for forming these electrodes is as described below. A photoresist is applied to the capping layer 26, is exposed using an exposure system, and is then developed, whereby a resist pattern, which is not illustrated, including openings corresponding to regions for forming the gate electrode 31, the source electrode 32, and the drain electrode 33 is formed. Thereafter, a metal film is formed over the resist pattern by vacuum vapor deposition or the like and is then immersed in an organic solvent or the like, whereby a portion of the metal film that is disposed on the resist pattern is removed together with the resist pattern. This allows the gate electrode 31, the source electrode 32, and the drain electrode 33 to be formed.

The semiconductor device according to this embodiment is an HEMT and can be manufactured as described above. In this embodiment, the low-resistance layer 223 is formed on the high-resistance layer 22. Therefore, even in the case where Fe is diffused from the high-resistance layer 22, an increase in on-resistance can be suppressed. The semiconductor device according to this embodiment can be rendered normally off because the electron travel layer 23 has a reduced thickness.

Figure 13:
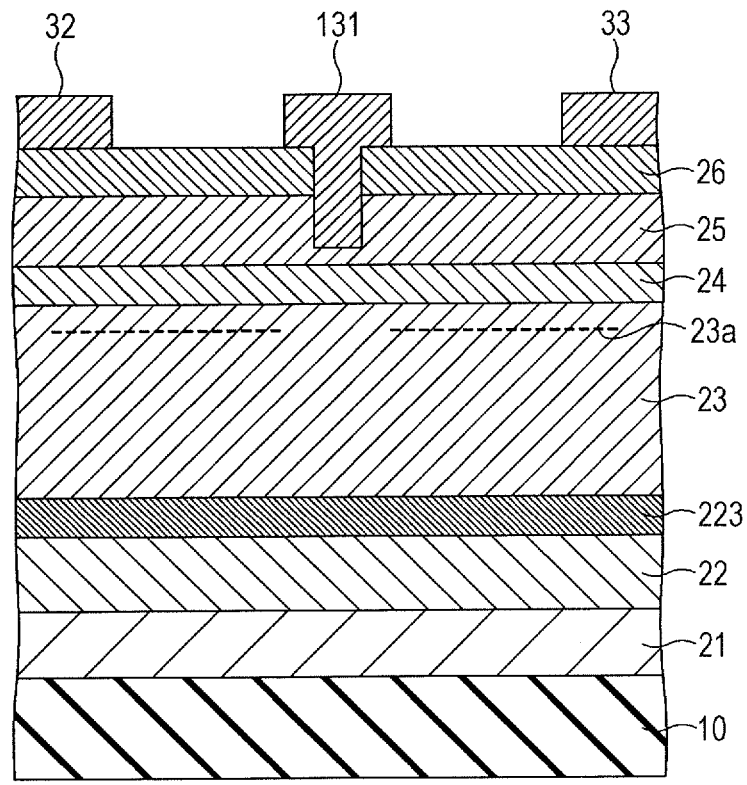
FIG. 13 is a structural view of a modification of the semiconductor device according to the third embodiment.

In the semiconductor device according to this embodiment, a gate electrode may have a recess structure. In particular, as illustrated in FIG. 13, the capping layer 26 and the electron supply layer 25 are partly removed by etching or the like, whereby an opening is formed. A gate electrode 131 is formed in the opening. The gate electrode 131 is formed so as to have a recess structure as described above; hence, the electron distribution of a 2DEG 23a can be reduced directly under the gate electrode 131 and the threshold voltage can be rendered positive. This allows a normally-off HEMT to be readily achieved.

Fourth Embodiment

A fourth embodiment is described below. This embodiment provides a semiconductor device, a power supply system, and a high-frequency amplifier.

Figure 14:
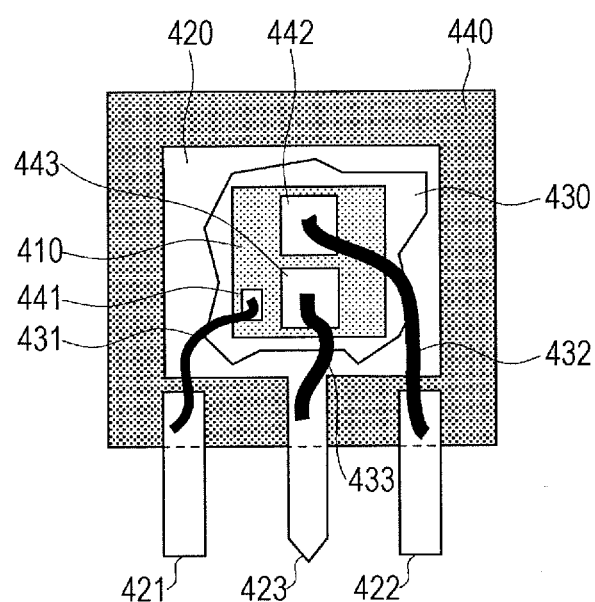
FIG. 14 is an illustration of a discretely packaged semiconductor device according to a fourth embodiment.

The semiconductor device according to this embodiment is one obtained by discretely packaging the semiconductor device according to any one of the first to third embodiments. The semiconductor device discretely packaged as described above is described with reference to FIG. 14. FIG. 14 schematically illustrates an inner portion of the discretely packaged semiconductor device. The arrangement of electrodes illustrated in FIG. 14 is different from those described in the first to third embodiments.

First, the semiconductor device manufactured in any one of the first to third embodiments is cut by dicing or the like, whereby a semiconductor chip 410 including a HEMT made of a GaN-based semiconductor material is prepared. The semiconductor chip 410 is fixed on a lead frame 420 with a die attach adhesive 430 such as solder.

Next, a gate electrode 441 is connected to a gate lead 421 with a bonding wire 431, a source electrode 442 is connected to a source lead 422 with a bonding wire 432, and a drain electrode 443 is connected to a drain lead 423 with a bonding wire 433. The bonding wires 431, 432, and 433 are made of a metal material such as Al. In this embodiment, the gate electrode 441 is a gate electrode pad and is connected to the gate electrode 31 described in any one of the first to third embodiments. Likewise, the source electrode 442 is a source electrode pad and is connected to the source electrode 32 described in any one of the first to third embodiments and the drain electrode 443 is a drain electrode pad and is connected to the drain electrode 33 described in any one of the first to third embodiments.

Next, resin sealing is performed by a transfer molding process using a molding resin 440. This allows the semiconductor device, which includes the discretely packaged HEMT made of the GaN-based semiconductor material, to be manufactured.

The power supply system and high-frequency amplifier according to this embodiment include the semiconductor device according to any one of the first to third embodiments.

Figure 15:
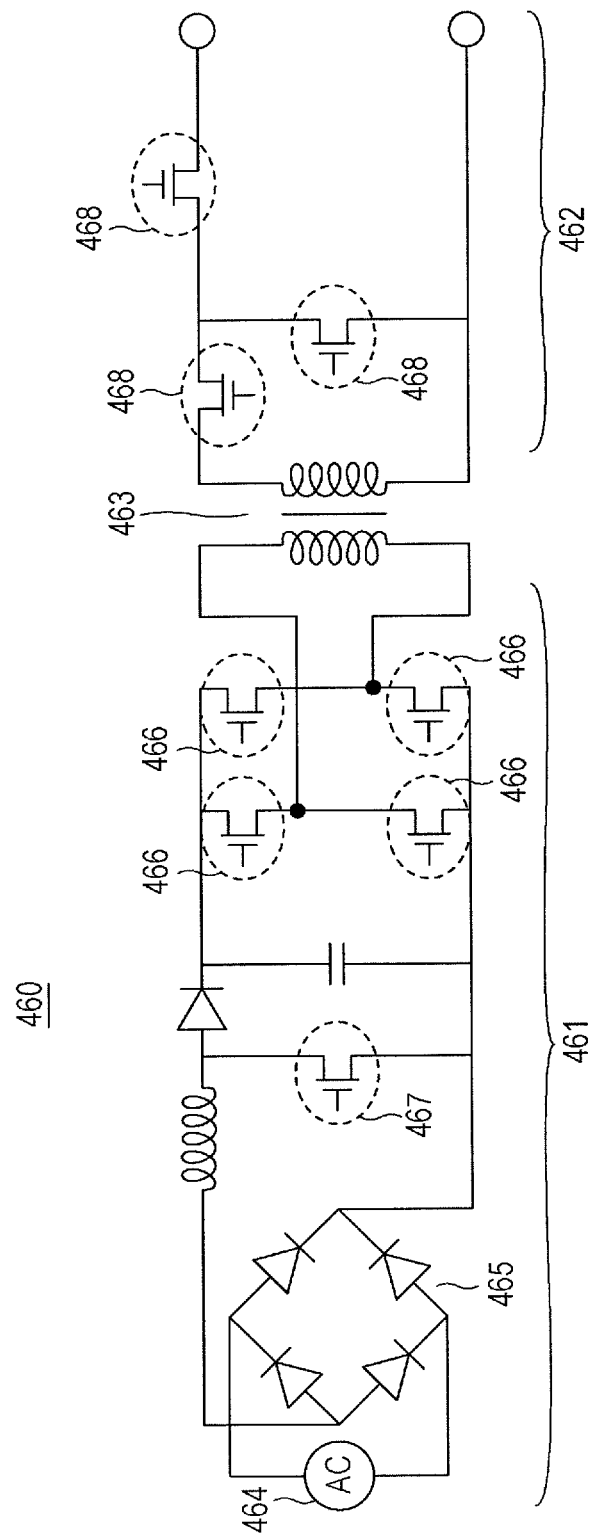
FIG. 15 is a circuit diagram of a power supply system according to the fourth embodiment.

The power supply system according to this embodiment is described below with reference to FIG. 15. The power supply system 460 according to this embodiment includes a high-voltage primary circuit 461, a low-voltage secondary circuit 462, and a transformer 463 placed between the primary circuit 461 and the secondary circuit 462. The primary circuit 461 includes an alternating-current power supply 464, a so-called bridge rectifier circuit 465, a plurality of switching elements 466 (the number thereof is four as illustrated in FIG. 15), and a single switching element 467. The secondary circuit 462 includes a plurality of switching elements 468 (the number thereof is three as illustrated in FIG. 15). In an example illustrated in FIG. 15, the switching elements 466 and 467 of the primary circuit 461 correspond to the semiconductor device according to any one of the first to third embodiments. The switching elements 466 and 467 of the primary circuit 461 are preferably normally-off semiconductor devices. The switching elements 468 used in the secondary circuit 462 use common metal-insulator-semiconductor field-effect transistors (MISFETs) made of silicon.

Figure 16:
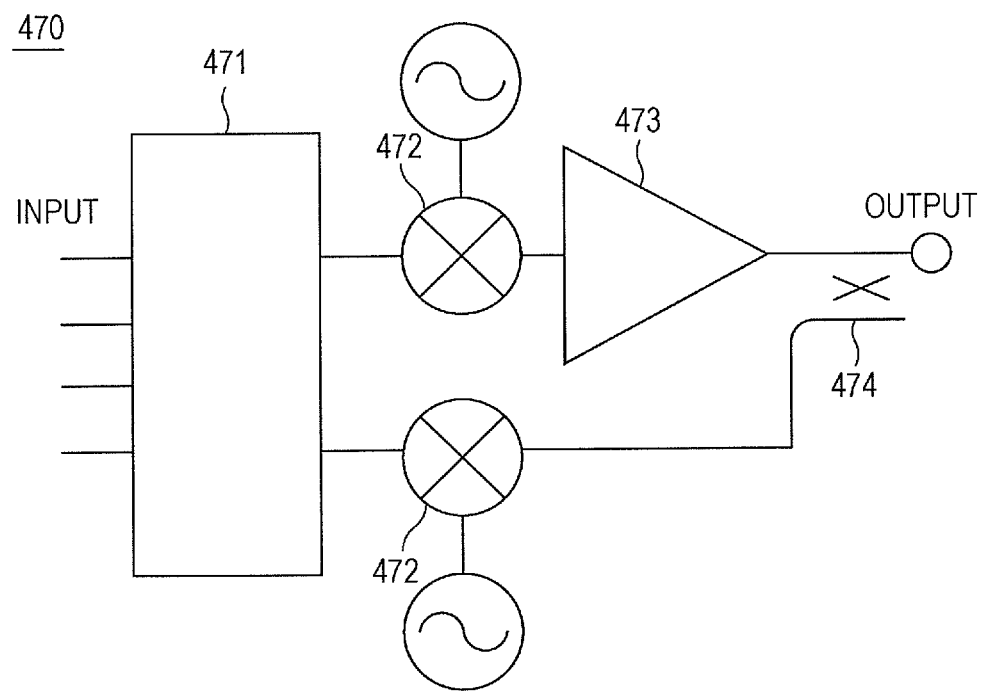
FIG. 16 is a structural view of a high-frequency amplifier according to the fourth embodiment.

The high-frequency amplifier according to this embodiment is described below with reference to FIG. 16. The high-frequency amplifier 470 according to this embodiment may be applied to, for example, a power amplifier for base stations for mobile phones. The high-frequency amplifier 470 according to this embodiment includes a digital pre-distortion circuit 471, a mixer 472, a power amplifier 473, and a directional coupler 474. The digital pre-distortion circuit 471 compensates for the non-linear distortion of an input signal. The mixer 472 mixes the input signal compensated for non-linear distortion with an alternating-current signal. The power amplifier 473 amplifies the input signal mixed with the alternating-current signal. With reference to FIG. 16, the power amplifier 473 includes the semiconductor device according to any one of the first to third embodiments. The directional coupler 474 monitors the input signal and an output signal. In a circuit illustrated in FIG. 16, switching allows the output signal to be mixed with the alternating-current signal by the mixer 472 and to be transmitted to the digital pre-distortion circuit 471.

While embodiments have been described above in detail, the disclosure is not limited to specific embodiments. Various modifications and variations can be made within the scope of the appended claims.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device, comprising:
   a buffer layer that is disposed over a substrate;
   a high-resistance layer that is disposed over the buffer layer, the high-resistance layer being doped with a transition metal for achieving high resistance;
   a low-resistance region that is disposed in an upper portion of the high-resistance layer or over the high-resistance layer, the low-resistance region being doped with an impurity element for achieving low resistance;
   an electron travel layer that is disposed over the high-resistance layer including the low-resistance region;
   an electron supply layer that is disposed over the electron travel layer;
   a gate electrode that is disposed over the electron supply layer; and
   a source electrode and a drain electrode that are disposed over the electron supply layer.

2. The semiconductor device according to claim 1, wherein low-resistance regions are disposed in a portion of the high-resistance layer or over the high-resistance layer, each of the source electrode and the drain electrode is disposed over a corresponding one of the low-resistance regions, and the gate electrode is disposed over a region other than the low-resistance regions.

3. The semiconductor device according to claim 1, wherein the gate electrode has a recess structure formed partly without the electron supply layer.

4. The semiconductor device according to claim 1, wherein the high-resistance layer, the low-resistance region, the electron travel layer, and the electron supply layer are made of a nitride semiconductor material.

5. The semiconductor device according to claim 1, wherein the high-resistance layer is made of GaN doped with the transition metal that is any one selected from the group consisting of Fe, Ti, V, Cr, Mn, Co, Ni, and Cu.

6. The semiconductor device according to claim 1, wherein the impurity element for achieving low resistance is any one selected from the group consisting of Si, Ge, and O.

7. The semiconductor device according to claim 1, wherein the electron travel layer is made of GaN.

8. The semiconductor device according to claim 1, wherein the electron supply layer is made of n-type AlGaN.

9. The semiconductor device according to claim 1, further comprising a spacer layer disposed between the electron travel layer and the electron supply layer, wherein the spacer layer is made of AlGaN.

10. The semiconductor device according to claim 1, further, comprising a capping layer that is disposed over the electron supply layer, wherein the capping layer is made of n-type GaN.

11. The semiconductor device according to claim 1, wherein the buffer layer is made of a material including AlN.

12. A semiconductor device, comprising:
    a buffer layer that is disposed over a substrate;
    a high-resistance layer that is disposed over the buffer layer, the high-resistance layer being doped with a transition metal for achieving high resistance;
    a low-resistance region that is disposed in a portion of the high-resistance layer or over the high-resistance layer, the low-resistance region being doped with an impurity element for achieving low resistance;
    an electron travel layer that is disposed over the high-resistance layer including the low-resistance region;
    an electron supply layer that is disposed over the electron travel layer;
    a gate electrode that is disposed over the electron supply layer; and
    a source electrode and a drain electrode that are disposed over the electron supply layer, wherein the concentration of the impurity element for achieving low resistance in each low-resistance region is higher than the concentration of the transition metal in the high-resistance layer.

13. A method for manufacturing a semiconductor device, comprising:
    forming a buffer layer over a substrate and a high-resistance layer over the buffer layer in an epitaxial growth apparatus, the high-resistance layer being doped with a transition metal;
    taking the substrate including the high-resistance layer from the epitaxial growth apparatus to provide the substrate including the high-resistance layer in another epitaxial growth apparatus;
    forming an electron travel layer and an electron supply layer in series over the high-resistance layer in the another epitaxial growth apparatus; and
    forming a gate electrode, a source electrode, and a drain electrode over the electron supply layer.

14. A method for manufacturing a semiconductor device, comprising:
    forming a buffer layer over a substrate and a high-resistance layer over the buffer layer, the high-resistance layer being doped with a transition metal;
    forming low-resistance regions in an upper portion of the high-resistance layer or over the high-resistance layer, the low-resistance regions being doped with an impurity element for achieving low resistance;
    forming an electron travel layer over an area including the low-resistance regions and an electron supply layer over the electron travel layer; and
    forming a gate electrode, a source electrode, and a drain electrode over the electron supply layer.

15. The method according to claim 14, wherein the low-resistance regions are formed by doping portions of high-resistance layer with the impurity element for achieving low resistance, each of the source electrode and the drain electrode is formed over a corresponding one of the low-resistance regions, and the gate electrode is formed over a region other than the low-resistance regions.

16. The method according to claim 14, wherein the impurity element for achieving low resistance is any one selected from the group consisting of Si, Ge, and O.

17. A method for manufacturing a semiconductor device, comprising:
    forming a buffer layer over a substrate and a high-resistance layer over the buffer layer, the high-resistance layer being doped with a transition metal, forming low-resistance regions in a portion of the high-resistance layer or over the high-resistance layer, the low-resistance regions being doped with an impurity element for achieving low resistance;

forming an electron travel layer over an area including the low-resistance regions and an electron supply layer over the electron travel layer;

forming a gate electrode, a source electrode, and a drain electrode over the electron supply layer, wherein the low-resistance regions are formed by doping portions of high-resistance layer with the impurity element for achieving low resistance, each of the source electrode and the drain electrode is formed over a corresponding one of the low-resistance regions, and the gate electrode is formed over a region other than the low-resistance regions; and forming an alignment mark in the high-resistance layer subsequently to the formation of the high-resistance layer, wherein the low-resistance regions are formed in such a manner that a resist pattern including apertures corresponding to the low-resistance regions is formed over a surface of the high-resistance layer with reference to the alignment mark, and the high-resistance layer is doped with the impurity element for achieving low resistance subsequently to the formation of the resist pattern, and the gate electrode, the source electrode, and the drain electrode are formed in such a manner that a resist pattern including apertures corresponding to the gate electrode, the source electrode, and the drain electrode is formed over the electron supply layer with reference to the alignment mark, and a metal film is formed over the resist pattern and is then lifted off.

18. A method for manufacturing a semiconductor device, comprising:

forming a buffer layer over a substrate and a high-resistance layer over the buffer layer, the high-resistance layer being doped with a transition metal;

forming low-resistance regions in a portion of the high-resistance layer or over the high-resistance layer, the lower-resistance regions being doped with the an impurity element for achieving low resistance;

forming an electron travel layer over an area including the low-resistance regions and an electron supply layer over the electron travel layer; and forming a gate electrode, a source electrode, and a drain electrode over the electron supply layer, wherein the concentration of the impurity element for achieving low resistance in each low-resistance region is higher than the concentration of the transition metal in the high-resistance layer.

* * * * *